United States Patent
Hedin et al.

(10) Patent No.: US 8,247,092 B2
(45) Date of Patent: Aug. 21, 2012

(54) COATED CUTTING TOOL AND A METHOD OF MAKING THEREOF

(75) Inventors: Andreas Hedin, Stockholm (SE); Mats Ahlgren, Täby (SE)

(73) Assignee: Sandvik Intellectual Property AB, Sandviken (SE)

( * ) Notice: Subject to any disclaimer, the term of this patent is extended or adjusted under 35 U.S.C. 154(b) by 366 days.

(21) Appl. No.: 12/594,057

(22) PCT Filed: Apr. 18, 2008

(86) PCT No.: PCT/SE2008/050442
§ 371 (c)(1),
(2), (4) Date: Oct. 21, 2009

(87) PCT Pub. No.: WO2008/130316
PCT Pub. Date: Oct. 30, 2008

(65) Prior Publication Data
US 2010/0135738 A1 Jun. 3, 2010

(30) Foreign Application Priority Data
Apr. 18, 2007 (SE) .................................. 0700947-5

(51) Int. Cl.
*B32B 9/00* (2006.01)
(52) U.S. Cl. ......... 428/697; 51/307; 51/309; 204/192.1; 204/192.15; 204/192.16; 204/192.38; 407/119; 428/336; 428/698; 428/699; 428/704
(58) Field of Classification Search .................... 51/307, 51/309; 428/336, 697, 698, 699, 704; 407/119
See application file for complete search history.

(56) References Cited

U.S. PATENT DOCUMENTS

| | | | | |
|---|---|---|---|---|
| 7,060,345 B2 * | 6/2006 | Fukui et al. | ............. | 428/699 |
| 7,294,416 B2 * | 11/2007 | Yamamoto et al. | ............. | 428/698 |
| 7,527,457 B2 * | 5/2009 | Moriguchi et al. | ............. | 51/307 |
| 7,592,076 B2 * | 9/2009 | Flink et al. | ............. | 428/697 |
| 7,732,066 B2 * | 6/2010 | Fukui et al. | ............. | 428/698 |
| 7,837,416 B2 * | 11/2010 | Omori et al. | ............. | 407/119 |
| 7,989,092 B2 * | 8/2011 | Sundstrom et al. | ............. | 428/697 |
| 2003/0118412 A1 | 6/2003 | Fukui et al. | | |
| 2006/0292399 A1 * | 12/2006 | Sjolen et al. | ............. | 428/698 |

FOREIGN PATENT DOCUMENTS

| | | |
|---|---|---|
| EP | 1 726 390 | 11/2006 |
| JP | 54-158778 | * 12/1979 |
| JP | 08-118106 | * 5/1996 |
| JP | 2004-074361 | * 3/2004 |

(Continued)

OTHER PUBLICATIONS

Noyan et al., *Residual Stress Measurement by Diffraction and Interpretation*, New York: Springer-Verlag (1987), pp. 117-130.

(Continued)

*Primary Examiner* — Archene Turner
(74) *Attorney, Agent, or Firm* — Morgan, Lewis & Bockius LLP

(57) ABSTRACT

The present invention relates to a cutting tool for metal machining with improved wear properties, comprising a cutting tool substrate of cemented carbide, cermet, ceramics or a super hard material, and a wear resistant coating, wherein the wear resistant coating comprises a PVD Ti—Si—C—N layer, and a method of making thereof.

15 Claims, 1 Drawing Sheet

FOREIGN PATENT DOCUMENTS

| JP | 2004-114219 | * | 4/2004 |
|----|-------------|---|--------|
| JP | 2005-262388 |   | 9/2005 |
| JP | 2006-181705 |   | 7/2006 |
| WO | WO 2006/118513 |   | 11/2006 |
| WO | WO 2007/013392 |   | 2/2007 |

OTHER PUBLICATIONS

Jeon et al, "Synthesis and characterization of quaternary Ti-Si-C-N coatings prepared by a hybrid deposition technique", *Surface & Coatings Technology*, vol. 188-189, (2004), pp. 415-419.

Ma et al., "Superhard nanocomposite Ti-Si-C-N coatings prepared by pulsed-d.c plasma enhanced CVD", *Surface & Coatings Technology*, vol. 200, (2005), pp. 382-386.

Ma et al., "Microstructure and tribiological behaviour of super-hard Ti-Si-C-N nanocomposite coatings deposited by plasma enhanced chemical vapour deposition", *Thin Solid Films*, vol. 496, (2006), pp. 438-444.

Xu et al, "Tribiological behavior of a TiSiCN coating tested in air and coolant", *Surface & Coatings Technology*, vol. 201, (2006), pp. 4236-4241.

* cited by examiner

US 8,247,092 B2

COATED CUTTING TOOL AND A METHOD OF MAKING THEREOF

This application is a §371 National Stage Application of PCT International Application No. PCT/SE2008/050442 filed Apr. 18, 2008, and claims priority under 35 U.S.C. §119 and/or §365 to Swedish Application No. 0700947-5, filed Apr. 18, 2007.

BACKGROUND OF THE INVENTION

The present invention relates to a coated cutting tool. More specifically, the invention pertains to a coated cutting tool comprising a wear resistant coating of the quarternary alloy Ti—Si—C—N, deposited on to a cutting tool using a method of physical vapour deposition combined with the introduction of a reactive gas as a method to incorporate Si into the coating at a continuous scale.

Modern high productivity chip forming machining of metals requires reliable tools with high wear resistance, good toughness properties and excellent resistance to plastic deformation. This has so far been achieved by applying a suitable coating to the surface of a tool substrate. As a result, the tool may be used at considerably higher cutting speed and feed. The coating is preferably hard, wear resistant and stable at high temperatures. The tool substrate is generally in the shape of an insert clamped in a tool holder, but can also be in the form of a solid drill or a milling cutter.

Cutting tools are generally optimized for a particular application area, defined by the special requirements on the tool, such as high resistance to crater wear, high resistance to flank wear etc. It is, however, desirable to extend the field of application by improving one or several properties without loss in other properties.

Physical Vapour Deposition (PVD) is a technology known for thin film growth of stable compounds. In the metal cutting industry PVD coatings including layers such as TiN, Ti(C,N) and (Ti,Al)N are among the most common. Evaporation of metal from targets is accomplished by electrical arc or ion bombardment in a reactive gas containing nitrogen or carbon. Very often the targets have the same metal composition as the final layer.

Ma et al. (Thin Solid Films 496 (2006), pp 438-444) and (Surface & Coatings Technology 200 (2005), pp 382 386) disclose depositing Ti—Si—C—N coatings on to high speed steel substrates using plasma enhanced chemical vapour deposition from $TiCl_4/SiCl_4/H_2/N_2/CH_2/Ar$ mixtures, wherein particularly the hardness behaviour of the deposited coating is evaluated.

Jeon et al. (Surface and Coatings Technology 188-189 (2004), pp 415-419) discloses Ti—Si—C—N coatings deposited on WC-Co substrates by a hybrid system combining the arc ion plating (AIP) and DC magnetron sputtering techniques using Ti and Si targets in an $Ar/N_2/CH_4$ gaseous mixture.

H. Xu et al. (Surface & Coatings Technology 201, 2006, pp 4236-4241) discloses deposition of a thick Ti—Si—C—N coating on to a stainless steel substrate in a plasma enhanced magnetron sputtering process using trimethylsilane. Pin-on-disc tests were conducted in order to evaluate the tribological properties with aluminium and alumina counterparts.

OBJECTS AND SUMMARY OF THE INVENTION

It is an object of the present invention to provide a PVD coated cutting tool for chip forming machining having improved wear resistance.

The present invention provides a cutting tool for metal machining comprising a cutting tool substrate of cemented carbide, cermet, ceramics or a super hard material, and a wear resistant coating, wherein the wear resistant coating comprises a PVD Ti—Si—C—N layer.

It is a further object of the present invention to provide a method for producing a PVD coated cutting tool for chip forming machining having improved wear resistance.

In a further aspect of the invention there is provided a method of making a cutting tool for metal machining wherein the method comprises depositing on to a cutting tool substrate of cemented carbide, cermet, ceramics or a super hard material, a PVD Ti—Si—C—N layer using arc evaporation with one or more Ti targets and an addition of trimethylsilane gas to the reactive gas atmosphere.

DETAILED DESCRIPTION OF THE PREFERRED EMBODIMENTS

Figure 1:
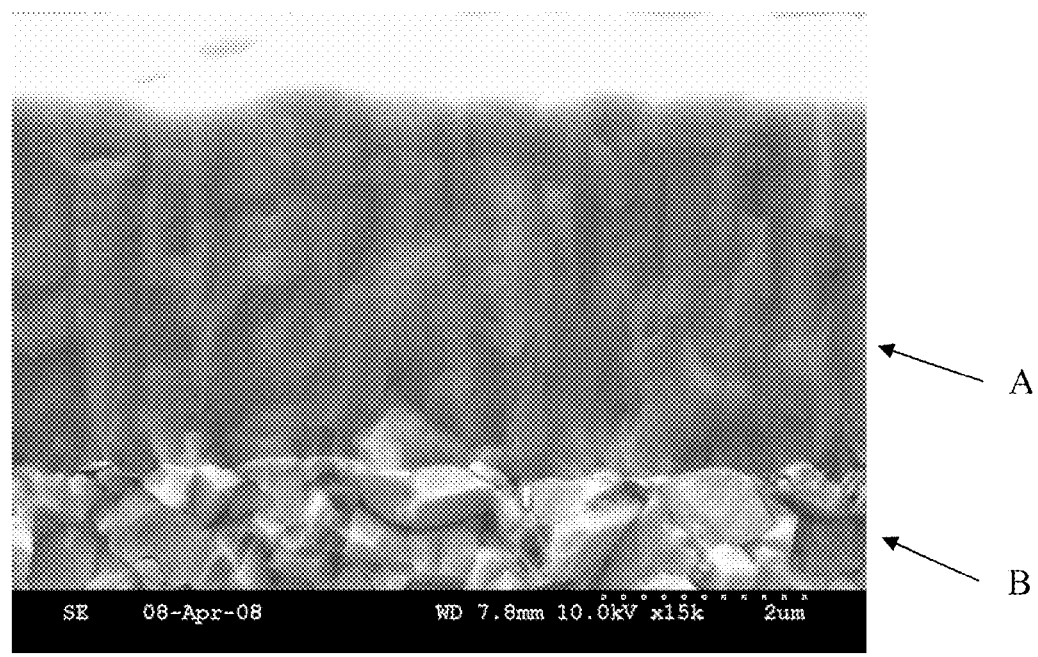
FIG. 1 shows a Scanning Electron Microscope micrograph of an exemplary coated cutting tool according to the present invention, in which
  A) Ti—Si—C—N coating
  B) Cutting tool substrate
Figure 2:
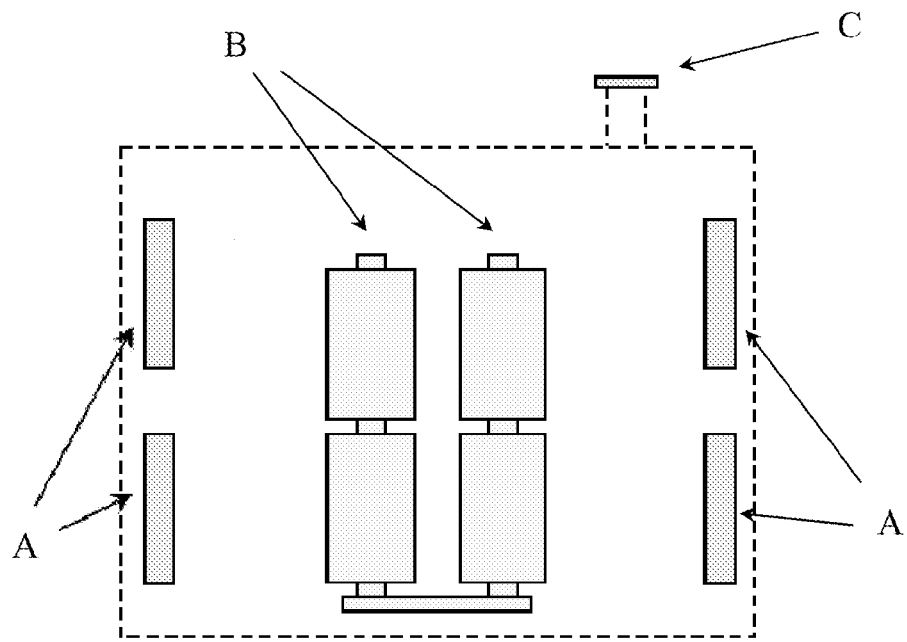
FIG. 2 shows schematically an exemplary target configuration of the arc evaporation equipment according to the present invention, in which
  A) Titanium targets
  B) Substrate holders
  C) Vacuum system, gas inlet

According to the present invention there is provided a cutting tool for metal machining, such as turning, milling and drilling, comprising a substrate of cemented carbide, cermet, ceramic or a super hard material, such as cubic boron nitride or diamond, preferably cemented carbide, and a hard and wear resistant refractory coating comprising a PVD Ti—Si—C—N layer.

The thickness of the PVD Ti—Si—C—N layer is preferably chosen in a range common for PVD functional layers for metal cutting tools, i.e. suitably 1 to 10 µm, preferably 2 to 7 µm, most preferably 2 to 5 µm.

The coating may include further layers such as e.g. a thin bonding layer between the substrate and the PVD Ti—Si—C—N layer, e.g. TiN, or an outermost layer for wear detection or colouring purposes, the total thickness of the deposited coating should, however, not exceed 11 µm, preferably not exceed 8 µm, to avoid spalling. In one embodiment the coating consists of a thin, preferably 0.2 to 1 µm thick, starting layer of, e.g., TiN, and a single Ti—Si—C—N functional layer, preferably 2 to 5 µm thick, possibly with a thin, preferably 0.2 to 1 µm thick, outermost colouring or wear detection layer of, e.g., TiN.

The composition of the Ti—Si—C—N coating, when seen as Si in relation to Ti, i.e. the Si/(Si+Ti) atomic ratio, is suitably 0.03 to 0.25, preferably 0.045 to 0.22. It has been found that lower ratios results in loss in flank wear resistance, whereas higher ratios results in a too brittle layer leading to loss in crater wear resistance.

The composition with regards C in relation to N, i.e. the C/(C+N) atomic ratio, is suitably 0.05 to 0.25, preferably 0.1 to 0.2. It has been found that below these values a decrease in hardness is obtained leading to unacceptable flank wear resistance. Too high C content, on the other hand, results in a too high residual compressive stress level and inferior cutting performance.

It is also preferred that the residual stress of the Ti—Si—C—N layer, measured in the (220)-direction, is suitably from −3.0 GPa (compressive stress) up to +0.5 GPa (tensile stress).

The hardness of the described Ti—Si—C—N coating can be in the range of 20 to 40 GPa. It has been found, however, that it is not possible to predict the performance in metal machining by studying the coating hardness. Results show that an increased hardness of the coating does not automatically lead to an increased wear resistance.

In one embodiment of the present invention said PVD Ti—Si—C—N layer has a Si/(Si+Ti) atomic ratio of 0.05 to 0.15, and a residual stress of −2.0 GPa (compressive stress) up to +0.5 GPa (tensile stress). It has surprisingly been found that such a cutting tool combines both high resistance to crater wear and high resistance to flank wear.

Exemplary metal cutting tools according to the invention are milling, turning, drilling or threading inserts, for clamping in a tool holder, but can also be in the form of a solid drill, a milling cutter or a threading tap.

According to the present invention there is provided a method for making a cutting tool for metal machining, comprising depositing a hard and wear resistant refractory PVD Ti—Si—C—N layer, with the ability to control the incorporation of silicon content on a continuous scale and the ability to control the residual stress of the described Ti—Si—C—N coating on a continuous scale, onto a substrate of cemented carbide, cermet, ceramic or a super hard material, such as cubic boron nitride or diamond, preferably cemented carbide, by PVD arc evaporation technique combined with the addition of trimethylsilane gas during deposition.

The PVD Ti—Si—C—N layer is preferably deposited to a thickness in a range common for PVD functional layers for metal cutting tools, i.e. suitably 1 to 10 μm, preferably 2 to 7 μm, most preferably 2 to 5 μm.

In the arc evaporation process, for depositing the Ti—Si—C—N layer, one or more targets of Ti are used together with the addition of trimethylsilane gas, $(CH_3)_3SiH$, at a constant flow controlled by a mass flow controller. As an important feature this procedure allows for continuously controlling the material composition of the deposited coatings, specifically the Si concentration, and still making use of the benefits of the mentioned arc evaporation process. It is preferred that the added trimethylsilane gas is the sole source of Si in the deposition process.

The deposition process is suitably performed at substrate temperatures between 400 to 600° C. The base pressure prior to deposition should be <50 μPa and the Ar sputtering gas flow is suitably in the range 0 to 500 sccm. The reactive gas such as $N_2$ and trimethylsilane is let in through a common inlet or through separate inlets. The $N_2$ flow is suitably in the range of 500 to 1000 sccm.

By varying the trimethylsilane gas flow it is possible to control the composition of the resulting coating, with regards to Si and C content.

The substrates are connected by a potential difference to the deposition chamber wall, this potential referred to as the substrate bias. The substrate bias is suitably in the range of −50 to −150 V. By varying the substrate bias the residual stress of the resulting coatings is controlled; by an increase in the substrate bias the residual compressive stress is increased.

Example 1

Samples 1-4 (Invention)

Cemented carbide inserts of ISO-type CNMG120408 for turning, consisting of 10 wt-% Co, 0.39 wt-% Cr and balance WC with a hardness of 1600 HV3, were cleaned and subjected to a PVD coating process according to the following. The inserts were loaded into a reactive arc evaporation type PVD equipment chamber containing four metal evaporation sources, arranged in two pairs. The inserts were further subjected to a three-fold rotation in order to coat them homogeneously. The evaporation sources had all Ti targets. The chamber was evacuated, followed by the steps of heating and plasma etching in order to further clean the tools, and to condition their surfaces by removing excess binder phase from the insert surface. By metal evaporation whilst maintaining a partial pressure of nitrogen in the coater a thin TiN adhesion layer was deposited at a temperature of 450° C. Next a wear resistant Ti—Si—C—N layer was deposited by arc evaporation of four Ti targets in a mixed Argon, Nitrogen and Trimethylsilane atmosphere. Argon was introduced in the process to avoid poisoning of the Ti-targets. It was found that an Argon flow of about 100-400 sccm was favourable, even though the process worked satisfactory also with zero Argon flow. The substrate bias level was chosen to obtain dense coatings with low compressive stresses. The deposition temperature of the wear resistant layer was 450° C. The details are given in Table 1.

TABLE 1

| | Samples 1-4 (invention) | | | | |
|---|---|---|---|---|---|
| Sample | Time [min.] | Bias [V] | Ar [sccm] | $N_2$ [sccm] | Trimethylsilane [sccm] |
| 1 | 120 | −75 | 300 | 700 | 42 |
| 2 | 120 | −90 | 100 | 700 | 125 |
| 3 | 120 | −90 | 300 | 700 | 42 |
| 4 | 120 | −125 | 300 | 700 | 83 |

The results of the analyses of the different coatings are shown in Table 2.

The Si/(Si+Ti) and C/(C+N) ratios were determined by Electron Probe Micro Analysis (EPMA). The average chemical composition was determined by EPMA using a JEOL JXA-8900R equipped with wavelength dispersive spectrometers at an acceleration voltage of 10 kV and a 10 nA probe current. Ti, Si and C contents were obtained by analysis while the N content was estimated by the difference between the sum of measured Ti, Si and C contents and 100 percent. The measurements were performed at the clearance side of the insert within 2 mm from the cutting edge.

X-ray diffraction technique, more specifically the $\sin^2\psi$ method (I. C. Noyan, J. B. Cohen, Residual Stress Measurement by Diffraction and Interpretation, Springer-Verlag, New York, 1987 (pp 117-130)), was used for determining the residual stress in the wear resistant layer.

A CSEM nano hardness tester was used to determine the hardness of the coatings. By using a load of 50 mN the contribution from the substrate was regarded as very small or none for all coatings.

The crater and flank wear resistance were measured in two different turning applications.

In the first test the crater wear resistance was evaluated. In this test the working material was a ball bearing steel. The cutting speed was 160 m/min. The feed was 0.3 mm/rev. and the cutting depth was 2.0 mm. The life time is defined as minutes in cut until the crater area becomes large enough to reach the cutting edge.

In the second test the flank wear resistance was evaluated. In this case a nodular cast iron was used as working material. The cutting speed was 200 m/min. The feed was 0.1 mm/rev. and the cutting depth was 2.0 mm. The time in cut was 2 min. After that the insert was examined on the flank face and proportion of the cutting edge which was worn through was determined.

TABLE 2

Samples 1-4 (invention)

| Sample | Thickness [μm] | Si/(Si + Ti) Ratio | C/(C + N) Ratio | Residual stress [GPa] | Hardness [GPa] | Crater Wear [min.] | Flank Wear [%] |
|---|---|---|---|---|---|---|---|
| 1 | 3.5 | 0.049 | 0.151 | −1.4 | 32 | 23 | 75 |
| 2 | 2.6 | 0.216 | 0.173 | −0.1 | 24 | 7 | 0 |
| 3 | 3.0 | 0.052 | 0.108 | −2.2 | 36 | 22 | 50 |
| 4 | 2.8 | 0.087 | 0.102 | −2.8 | 39 | 22 | 100 |

From Table 2 it is clear that it is possible to optimise the tool with regards its resistance to crater wear or flank wear.

Samples 5-10 (Invention)

Inserts of the same composition and ISO-type as for Sample 1-4 were cleaned and subjected to a PVD coating process as described in Samples 1-4.

TABLE 3

Samples 5-10 (invention)

| Sample | Time [min.] | Bias [V] | Ar [sccm] | $N_2$ [sccm] | Trimethylsilane [sccm] |
|---|---|---|---|---|---|
| 5 | 120 | −75 | 300 | 700 | 62 |
| 6 | 120 | −75 | 300 | 700 | 83 |
| 7 | 120 | −90 | 200 | 700 | 83 |
| 8 | 120 | −75 | 0 | 700 | 83 |
| 9 | 120 | −100 | 300 | 700 | 83 |
| 10 | 150 | −75 | 300 | 700 | 66 |

TABLE 4

Results Samples 5-10 (invention)

| Sample | Thickness [μm] | Si/(Si + Ti) Ratio | C/(C + N) Ratio | Residual stress [GPa] | Hardness [GPa] | Crater wear [min.] | Flank Wear [%] |
|---|---|---|---|---|---|---|---|
| 5 | 3.3 | 0.089 | 0.147 | −0.7 | 32 | 21 | 0 |
| 6 | 3.2 | 0.110 | 0.177 | +0.3 | 29 | 13 | 0 |
| 7 | 2.6 | 0.131 | 0.130 | −1.8 | 36 | 21 | 0 |
| 8 | 3.0 | 0.106 | 0.119 | −2.0 | — | 22 | 0 |
| 9 | 2.8 | 0.138 | 0.156 | −1.1 | 33 | 21 | 0 |
| 10 | 4.7 | 0.091 | 0.115 | −0.8 | — | 24 | 0 |

The Samples 5-10 in Table 4 show that it is possible to obtain for the same coating a both superior crater and flank wear resistance when the deposition parameters are carefully selected according to the present invention.

Sample 11-12 (Prior Art)

Cemented carbide inserts of the same composition and ISO-type as for Samples 1-4 were coated according to two different coating schemes.

Sample 11, being a commercially available state of the art grade particularly for applications demanding high crater wear resistance, such as turning of steel, was coated with a 4.1 μm PVD lamella layers with alternating layers of TiN and $Al_{0.5}Ti_{0.5}N$. The thickness of each individual TiN or $Al_{0.5}Ti_{0.5}N$-layer was 0.1-20 nm. The average composition of the multilayer was $Al_{0.15}Ti_{0.85}N$ measured with SEM-EDS.

Sample 12, being a commercially available state of the art grade particularly for hard work materials, such as HRSA and Inconel, was coated with a 3.9 μm PVD coating with composition $Al_{0.67}Ti_{0.33}N$ as measured by SEM-EDS.

Samples 11 and 12 were subjected to the same two machining tests as Samples 1-4 and the results are shown in Table 5.

TABLE 5

Results Samples 11 and 12 (Prior art)

| Sample | Crater Wear [min.] | Flank Wear [%] |
|---|---|---|
| 11 | 21 | 100 |
| 12 | 6 | 0 |

Samples 11 and 12 represent cutting tool inserts particularly developed for applications demanding high crater wear resistance and high resistance to flank wear, respectively, which is also confirmed by the above results. Comparing these results with the results of embodiments of the invention according to Samples 5-10, Table 4, clearly shows the remarkable effect, wherein both high resistance to crater wear and high resistance to flank wear is combined in a single cutting tool.

The invention claimed is:

1. Method of making a cutting tool for metal machining comprising depositing on to a cutting tool substrate of cemented carbide, cermet, ceramics or a super hard material, a PVD Ti—Si—C—N layer using arc evaporation with one or more Ti targets and an addition of trimethylsilane gas to the reactive gas atmosphere, wherein said PVD Ti—Si—C—N layer has a residual stress of from −3.0 GPa compressive stress up to +0.5 GPa tensile stress.

2. Method of making a cutting tool according to claim 1, wherein said PVD Ti—Si—C—N layer has a Si/(Si+Ti) atomic ratio of 0.03 to 0.25.

3. Method of making a cutting tool according to claim 1, wherein said PVD Ti—Si—C—N layer has a C/(C+N) atomic ratio of 0.05 to 0.25.

4. Method of making a cutting tool according to claim 1, wherein the thickness of said PVD Ti—Si—C—N layer is 1 to 10 um.

5. A cutting tool obtainable by the method according to claim 1.

6. A cutting tool for metal machining comprising a cutting tool substrate of cemented carbide, cermet, ceramics or a super hard material, and a wear resistant coating, wherein the wear resistant coating comprises a PVD Ti—Si—C—N layer, wherein said PVD Ti—Si—C—N layer has a residual stress of from −3.0 GPa compressive stress up to +0.5 GPa tensile stress.

7. A cutting tool according to claim 6, wherein said PVD Ti—Si—C—N layer has a Si/(Si+Ti) atomic ratio of 0.03 to 0.25.

8. A cutting tool according to claim 6, wherein said PVD Ti—Si—C—N layer has a Si/(Si+Ti) atomic ratio of 0.05 to 0.15, and a residual stress of from −2.0 GPa compressive stress up to +0.5 GPa tensile stress.

9. A cutting tool according to claim 6, wherein said PVD Ti—Si—C—N layer has a C/(C+N) atomic ratio of 0.05 to 0.25.

10. A cutting tool according to claim 6, wherein said cutting tool substrate is of cemented carbide.

11. A cutting tool according to claim 6, wherein said tool is a cutting tool insert.

12. A cutting tool according to claim 6, wherein said tool is a solid drill, a milling cutter or a threading tap.

13. A cutting tool according to claim 6, wherein the thickness of said PVD Ti—Si—C—N layer is 1 to 10 um.

14. Method of making a cutting tool according to claim 2, wherein said PVD Ti—Si—C—N layer has a residual stress of from −3.0 GPa compressive stress up to +0.5 GPa tensile stress.

15. A cutting tool according to claim 7, wherein said PVD Ti—Si—C—N layer has a residual stress of from −3.0 GPa compressive stress up to +0.5 GPa tensile stress.

* * * * *